(12) United States Patent
Hrebien

(10) Patent No.: US 11,042,204 B2
(45) Date of Patent: Jun. 22, 2021

(54) SYSTEM AND METHOD FOR MANAGING ELECTRIC POWER CONSUMPTION

(71) Applicant: ADVANCED DIGITAL BROADCAST S.A., Eysins (CH)

(72) Inventor: Maciej Hrebien, Zielona Gora (PL)

(73) Assignee: ADVANCED DIGITAL BROADCAST S.A., Bellevue (CH)

( * ) Notice: Subject to any disclaimer, the term of this patent is extended or adjusted under 35 U.S.C. 154(b) by 0 days.

(21) Appl. No.: 15/987,928

(22) Filed: May 24, 2018

(65) Prior Publication Data

US 2018/0341314 A1    Nov. 29, 2018

(30) Foreign Application Priority Data

May 24, 2017   (EP) .................................... 17172719

(51) Int. Cl.
*G06F 1/3228* (2019.01)
*G06F 1/3234* (2019.01)
*G01R 19/25* (2006.01)
*G06Q 50/06* (2012.01)

(52) U.S. Cl.
CPC ....... *G06F 1/3228* (2013.01); *G01R 19/2513* (2013.01); *G06F 1/3234* (2013.01); *G06Q 50/06* (2013.01); *G05B 2219/2642* (2013.01)

(58) Field of Classification Search
CPC .... G06F 1/3228; G06F 1/3234; G06F 9/4881; G06F 1/3203; G06Q 50/06; G01R 19/2513
USPC ........................................................ 700/296
See application file for complete search history.

(56) References Cited

U.S. PATENT DOCUMENTS

| 7,290,152 | B2 * | 10/2007 | Dubinsky | G06F 1/3203 |
| | | | | 713/300 |
| 8,245,062 | B1 * | 8/2012 | Nanda | G06F 1/3228 |
| | | | | 713/300 |
| 2005/0187727 | A1 * | 8/2005 | Weik | H02J 3/14 |
| | | | | 700/291 |
| 2005/0192713 | A1 * | 9/2005 | Weik | G06Q 50/188 |
| | | | | 700/295 |

(Continued)

FOREIGN PATENT DOCUMENTS

EP     3157121 A1    4/2017

OTHER PUBLICATIONS

Brazier, Frances M. T., Cornelissen, Frank, Gustavsson, Rune, Jonker, Catholijn M., Lindeberg, Olle, Polak, Bianca and Treur, Jan, "A Multi-Agent System Performing One-To-Many Negotiation for Load Balancing of Electricity Use", Electronic Commerce Research And Applications, 1 (2002) 208-224 (Year: 2002).*

*Primary Examiner* — Rocio Del Mar Perez-Velez
*Assistant Examiner* — Alicia M. Choi
(74) *Attorney, Agent, or Firm* — Mark M. Friedman

(57) ABSTRACT

Method for managing electric power consumption. In particular, the present invention relates to optimizing power consumption in a collision-free manner while modifying power consumption states in a device comprising a plurality of modules requiring electric power. Accordingly, there is present an additional module called an arbitrator module (or otherwise negotiator or supervisor). This module accepts requests for changing a state of power consumption (for example in order to minimize power consumption when not in active use) and negotiates conditions of changing to that state of power consumption with all registered modules.

9 Claims, 10 Drawing Sheets

(56) References Cited

U.S. PATENT DOCUMENTS

| | | | | |
|---|---|---|---|---|
| 2007/0135086 A1* | 6/2007 | Stanford | ............... | H04L 12/10 455/402 |
| 2007/0245161 A1* | 10/2007 | Shaw | ................... | G06F 1/3203 713/300 |
| 2008/0015742 A1* | 1/2008 | Kulyk | ..................... | H02J 3/14 700/295 |
| 2010/0165896 A1* | 7/2010 | Gong | ............... | H04W 52/0216 370/311 |
| 2010/0185882 A1* | 7/2010 | Arnold | ................ | G06F 1/3203 713/320 |
| 2011/0191608 A1* | 8/2011 | Vetteth | ................... | G06F 15/16 713/310 |
| 2012/0290864 A1* | 11/2012 | Seroff | ................... | G06F 1/3206 713/340 |
| 2013/0054988 A1* | 2/2013 | Litovtchenko | ....... | G06F 1/3203 713/300 |
| 2013/0254571 A1* | 9/2013 | Tian | ................. | H04W 52/0274 713/323 |
| 2013/0274939 A1* | 10/2013 | Eger | ............... | H02J 13/00016 700/291 |
| 2013/0315614 A1* | 11/2013 | Tsukada | ............ | G03G 15/5004 399/88 |
| 2014/0277795 A1* | 9/2014 | Matsuoka | ......... | G06Q 30/0202 700/291 |
| 2014/0336836 A1* | 11/2014 | Borrett | .................. | G06Q 50/06 700/295 |
| 2017/0372244 A1* | 12/2017 | Westergaard | ...... | G06Q 30/0202 |

\* cited by examiner

SYSTEM AND METHOD FOR MANAGING ELECTRIC POWER CONSUMPTION

TECHNICAL FIELD

The present invention relates to a system and method for managing electric power consumption. In particular, the present invention relates to optimizing power consumption in a collision-free manner while modifying power consumption states in a device comprising a plurality of modules requiring electric power.

BACKGROUND OF THE INVENTION

A prior art publication WO 2009067257 A1 entitled "Energy use control system and method" discloses devices and systems that control energy usage in accordance with instructions from a head end system. A device may be instructed to cease energy consumption. Another device may allow users to override some instructions. Messages may be provided to users to request the cessation of energy consumption; the users may, but need not comply.

In this prior art, a device may be instructed to cease energy consumption entirely. A time and duration may be specified. The request may specify a class of devices, or alternatively a specific device.

A drawback of this solution is that if a programmed device is requested to cease operation it may in the end not execute its programmed tasks. Thus this solution is not optimum from users' perspective.

It would be advantageous to provide an optimized power consumption, in a collision-free manner, while modifying power consumption states in a device comprising a plurality of modules requiring electric power.

SUMMARY AND OBJECTS OF THE PRESENT INVENTION

An object of the present invention is a method for managing electric power consumption of a device, the method being characterized in that it comprises the steps of: executing an acceptance of a request to change power consumption state if the requested state is different from the current one; in case a negotiation process, of at least one power consumption state transition, is ongoing, adding said request to a queue of current negotiations; when the request is ready to be processed, according to said queue, executing a negotiation of the request; notifying and asking all listener modules, listening to the state power consumption change under negotiations, whether they agree to the power consumption change, based on their current tasks and scheduled tasks; collecting responses from all modules participating in said negotiations; taking a decision on power consumption state change according to the collected responses.

Preferably, during power state change negotiations each module responds in one of four ways: refusal of the request, approval of the request, conditional approval of the request for a given period of time $T_2$, request re-negotiations after a timeout $T_1$.

Preferably, when there are present at least two conditional approval of the request then the longest time, requested by any of the modules, is applied in case the power state transition increases power consumption and the shortest time is be applied when the power state transition decreases power consumption and thereafter the remaining modules are notified accordingly.

Preferably, wherein in case when more than one re-negotiations requests have been received, the longest time, reported by said re-negotiations requests from the respective modules, is applied.

Preferably, power consumption states are arranged hierarchically, wherein each state has a priority level assigned.

Preferably, a transition map, between given power consumption states, presetting modules that negotiate a given transition and modules that observe the given transition.

Preferably, the decision is sent to all modules taking part in the negotiations so that they apply a given power consumption state in a synchronous manner.

Preferably, in case at least one module refuses a power consumption state transition request, the remaining modules are notified accordingly and the transition process is discarded.

Another object of the present invention is a computer program comprising program code means for performing all the steps of the computer-implemented method according to the present invention when said program is run on a computer.

Another object of the present invention is a computer readable medium storing computer-executable instructions performing all the steps of the computer-implemented method according to the present invention when executed on a computer.

BRIEF DESCRIPTION OF THE DRAWINGS

These and other objects of the invention presented herein, are accomplished by providing a system and method for managing electric power consumption. Further details and features of the present invention, its nature and various advantages will become more apparent from the following detailed description of the preferred embodiments shown in a drawing, in which.

NOTATION AND NOMENCLATURE

Figure 1A:
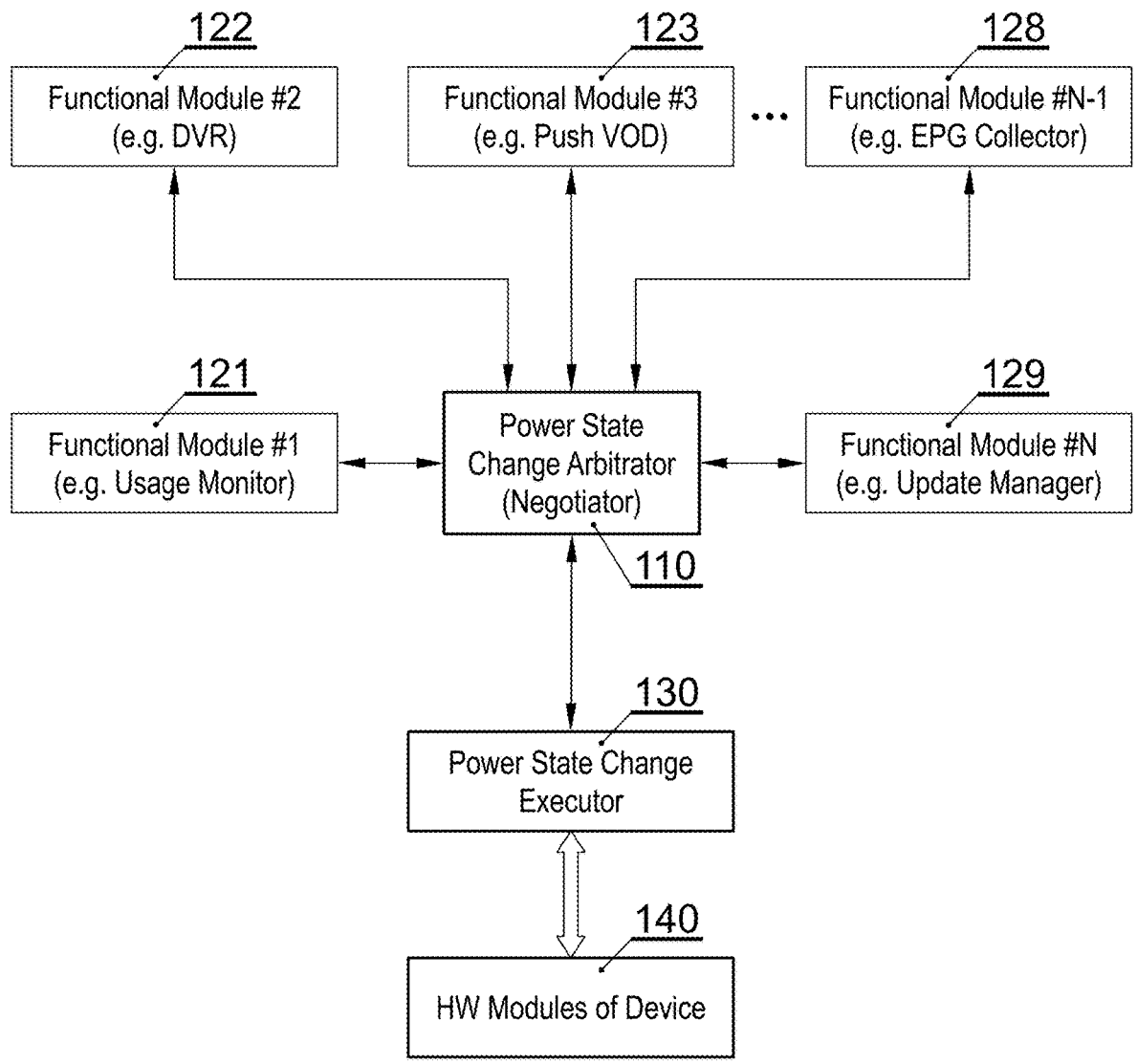
FIG. 1A shows a relation between an arbitrator module, functional modules and an abstraction layer forcing a given state on hardware components.

Some portions of the detailed description which follows are presented in terms of data processing procedures, steps or other symbolic representations of operations on data bits that can be performed on computer memory. Therefore, a computer executes such logical steps thus requiring physical manipulations of physical quantities.

Usually these quantities take the form of electrical or magnetic signals capable of being stored, transferred, combined, compared, and otherwise manipulated in a computer system. For reasons of common usage, these signals are referred to as bits, packets, messages, values, elements, symbols, characters, terms, numbers, or the like.

Additionally, all of these and similar terms are to be associated with the appropriate physical quantities and are merely convenient labels applied to these quantities. Terms such as "processing" or "creating" or "transferring" or "executing" or "determining" or "detecting" or "obtaining" or "selecting" or "calculating" or "generating" or the like, refer to the action and processes of a computer system that manipulates and transforms data represented as physical (electronic) quantities within the computer's registers and memories into other data similarly represented as physical quantities within the memories or registers or other such information storage.

A computer-readable (storage) medium, such as referred to herein, typically may be non-transitory and/or comprise a non-transitory device. In this context, a non-transitory storage medium may include a device that may be tangible, meaning that the device has a concrete physical form, although the device may change its physical state. Thus, for example, non-transitory refers to a device remaining tangible despite a change in state.

As utilized herein, the term "example" means serving as a non-limiting example, instance, or illustration. As utilized herein, the terms "for example" and "e.g." introduce a list of one or more non-limiting examples, instances, or illustrations.

DESCRIPTION OF EMBODIMENTS

The aim of the present invention is solving a problem of collision-free transitions between power consumption states of a given device, which comprises a plurality of functional modules. Each of the modules implements particular functions such as, signal reception, signal processing, data storage, software download, software update, clean-up tasks, system monitoring tasks, cooling systems management etc.

Additionally, each of said modules operates according to its schedule, for example recording of audio/video content is executed at scheduled times. Such schedule may be static or dynamic i.e. a static action is repeated every given period e.g. every day at the same time while a dynamic action is scheduled depending on actual needs. For example, software update check may be a static action executed at 2 a.m. while a series recording may have a dynamic character depending on data provided by an electronic program guide.

Thus, transitions between power consumption states shall be executed such that there is a minimum disturbance of currently executed of scheduled tasks. Further, a mechanism of transitions between power consumption states should minimize communication bandwidth required to determine whether a given power consumption state is possible at a given instant i.e. whether forcing the given power consumption state will not negatively affect at least one functional modules of the device.

According of the present invention there is present an additional module called an arbitrator module (or otherwise negotiator or supervisor). This module accepts requests for changing a state of power consumption (for example in order to minimize power consumption when not in active use) and negotiates conditions of changing to that state of power consumption with all registered modules. Additionally, the arbitrator collects responses from said modules taking part in said negotiations, takes a final decision regarding the change of state and broadcasts this decision to all registered modules that are interested in such information and lastly the arbitrator module forces entering of the given power consumption state.

FIG. 1A shows a relation between the arbitrator module, functional modules and an abstraction layer forcing a given state on hardware components. The arbitrator module (110) is communicatively connected to one or more functional modules (121, 122, 123, 128, 129). These functional modules may be modules such as a DVR module (122), a VOD module (123), EPG data collector module (128), a usage monitoring module (121) or a software update manager module (129) or the like. In fact any module executing tasks requiring power consumption may be registered with and in communication with the arbitrator module (110).

Further, arbitrator module (110) is communicatively connected to a power state change executor (130). This is typically a low level module that is configured to force a given power state on hardware modules (140).

Figure 1B:
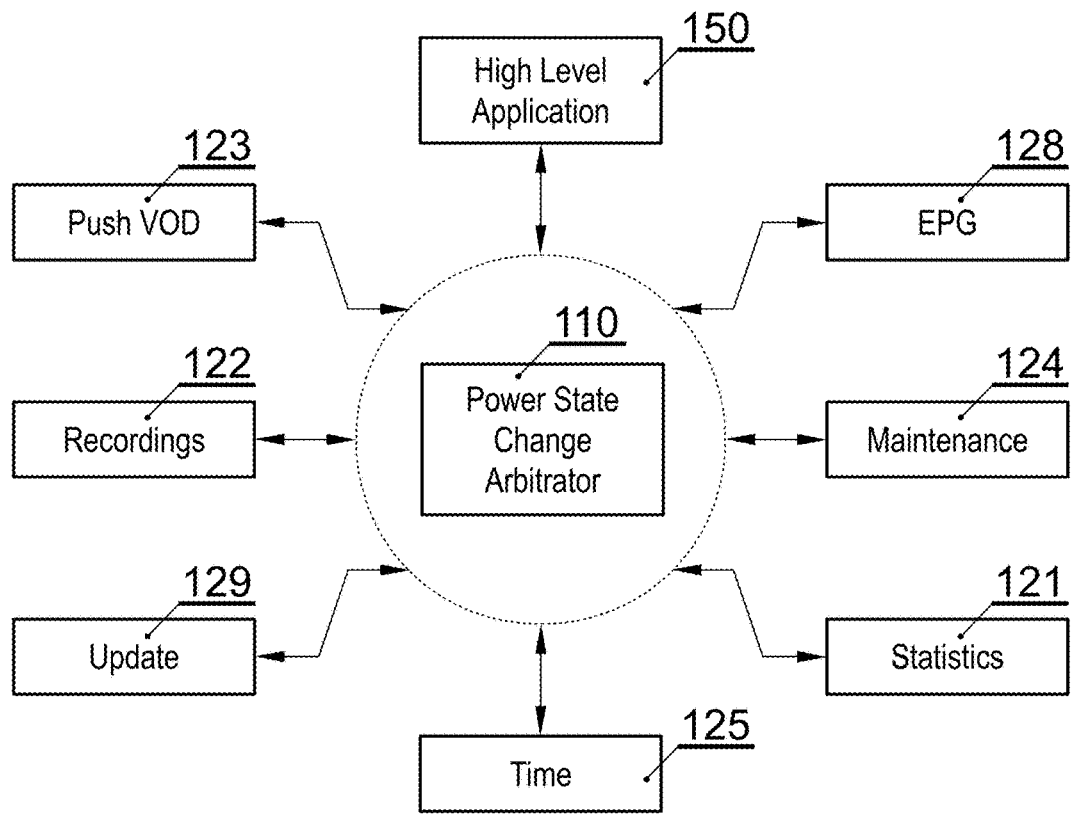
FIG. 1B presents a relation between the arbitrator module and modules implementing high level functions (including software applications)

FIG. 1B presents a relation between the arbitrator module and modules implementing high level functions (including software applications). Similarly, the arbitrator module (110) may be communicatively connected to software modules or a mix of hardware and software modules. In case of software the communication between the arbitrator module (110) and a given software module may be effected by appropriate events and listeners. The high level modules may implement functions such as maintenance (124) or high level user applications (150).

Figure 2:
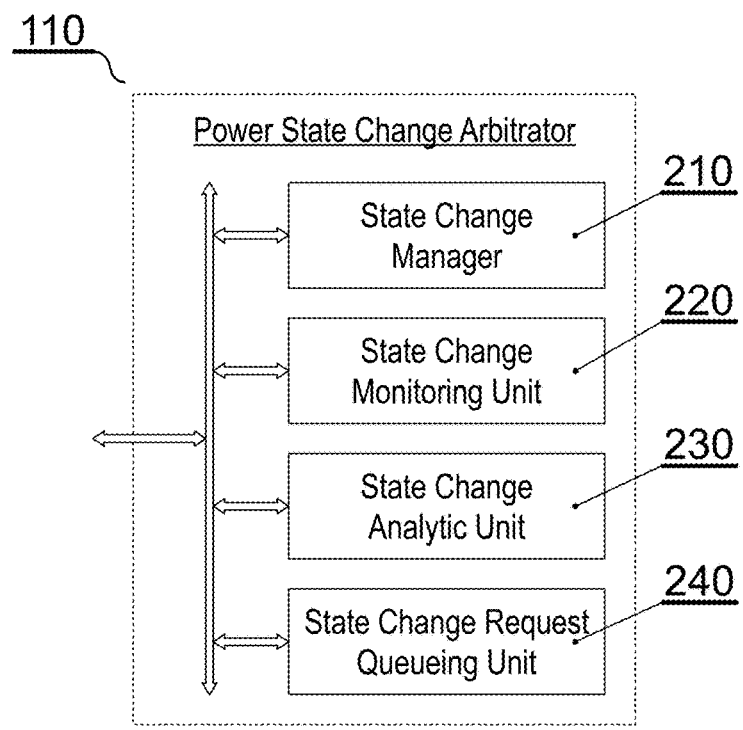
FIG. 2 depicts a structure of the arbitrator module i.e. individual modules implementing partial functions.

FIG. 2 depicts a structure of the arbitrator module i.e. individual modules implementing partial functions. It comprises four key units. The state change manager (210) manages current power consumption state i.e. it is aware regarding the current power consumption state of the device as well as the device's respective modules and hardware components. This information is stored in memory.

A state change monitoring unit (220) monitors transitions of modules and hardware components into given power consumption states. It is an important function especially in relation to step (621) i.e. in this step there is required confirmation that all modules and hardware components have reached a given state.

A state change analytic unit (230) analyses responses of modules during a negotiations process in particular when all relevant modules have responded to an inquiry regarding a transition into a selected power consumption state (609-614).

A state change request queuing unit (240) is managing queuing of transition requests (603-606).

Figure 3:
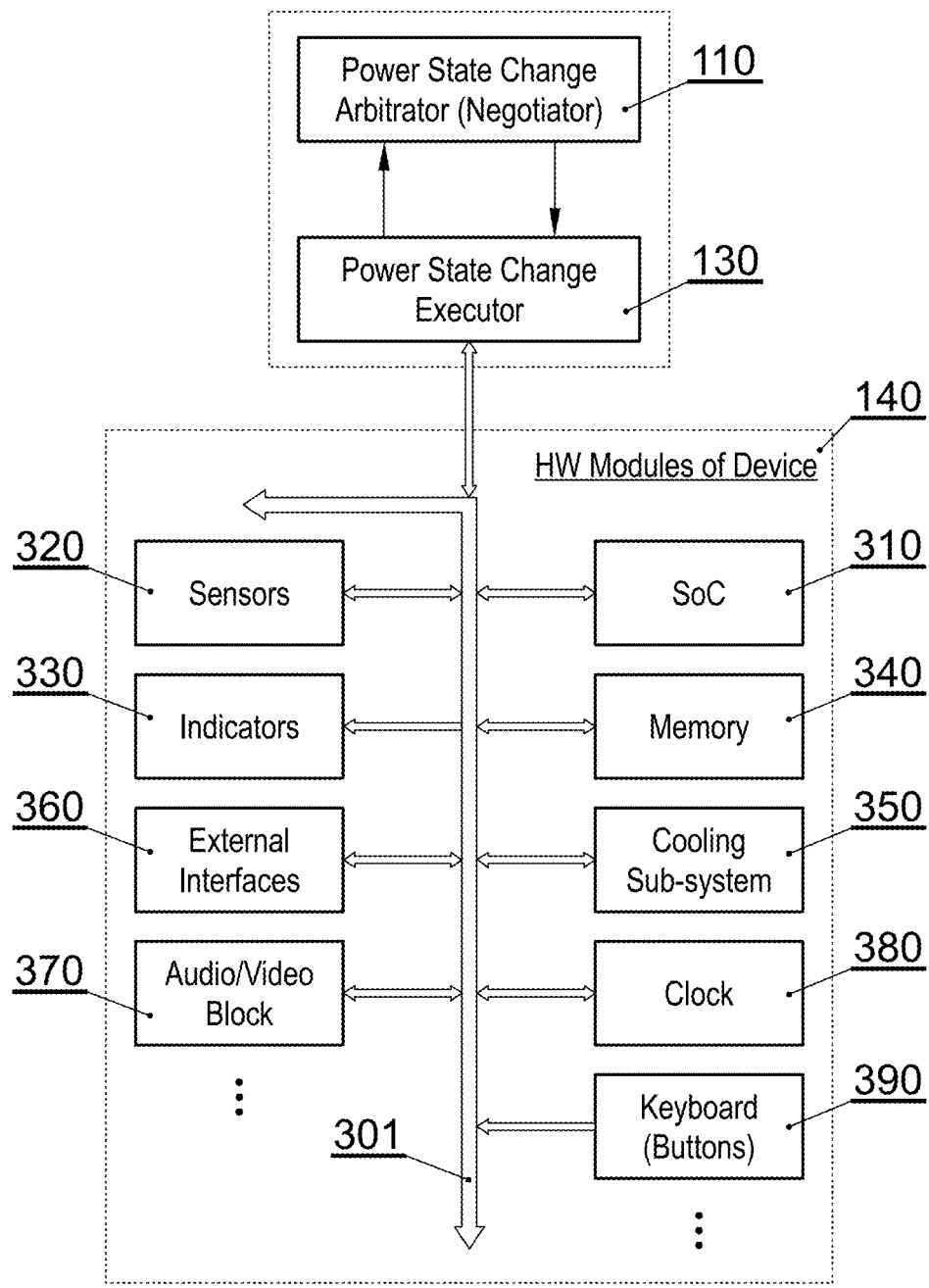
FIG. 3 shows a relation between the arbitrator module and an execution module forcing a given power consumption state on hardware components.

FIG. 3 shows a relation between the arbitrator module (110) and an execution module forcing a given power consumption state on hardware components. Depending on the device type, such as a set-top box or a mobile device such as a tablet or a smartphone these hardware components may be different depending on design requirements. In this example, a device (104) comprises a system-on-chip module (310) or otherwise a controller for managing functions of the remaining modules. Other modules may include one or more sensors (320) such as a proximity sensor, a camera sensor, a GPS sensor, an infrared sensor or the like.

Further, the device comprises one or more types of memory (340), status indicators (330), external interfaces (360), audio/video block (370), a clock (380), a cooling subsystem (350), which execute typical functions known to a person skilled in the art.

It is to be noted that the arbitrator module (110) and the power state change executor (130) may be implemented as software or as hardware or as a mix of the two approaches.

Figure 4A:
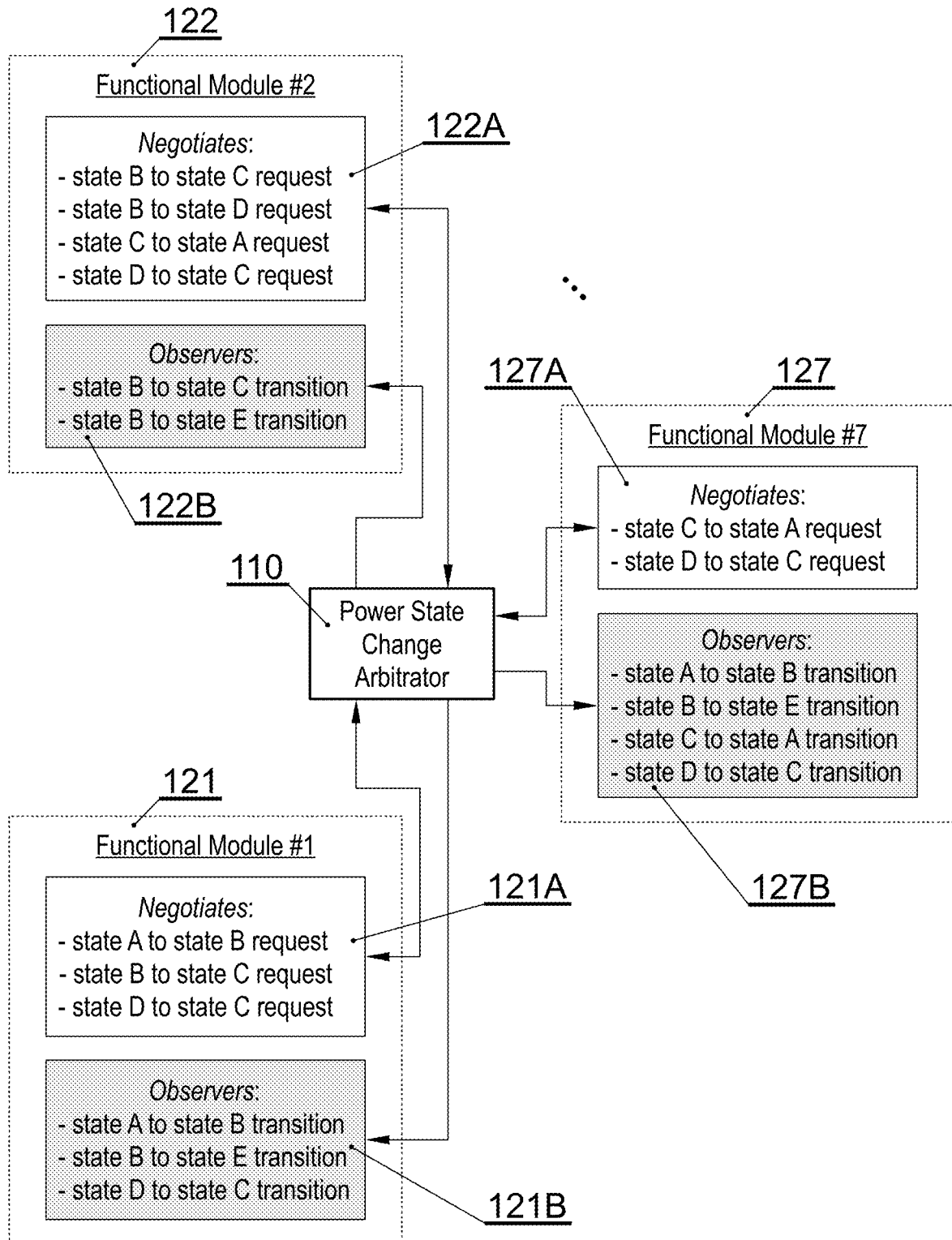
FIG. 4A depicts a relation between the arbitrator module and modules negotiating transitions between requested states and listening modules observing changes of states.

FIG. 4A depicts a relation between the arbitrator module and modules negotiating transitions between requested states and listening modules observing changes of states. Each functional module (122, 127, 121) is configured to register with the arbitrator module (110) in order to negotiate power state transitions (122A, 127A, 121A) and observe (122B, 127B, 121B) power state transitions in order to appropriately react to them. To this end, each functional module (122, 127, 121) may access a suitable memory comprising a list of its negotiated states and observed transitions.

For example, the functional module (127) negotiates a change from power consumption state C to power consumption state A. In this context, it may be an internal power consumption state of this particular functional module or a global power consumption state of the device as a whole.

Similarly, the functional module (122) observes a change from power consumption state B to power consumption state C. This allows to execute actions in response to such power state changes. For example, in case of an audio/video receiver (such as a set-top box) output A/V ports may be disabled in response to observing a transition. A/V ports are typically disabled in background recording in stand-by mode.

Figure 4B:
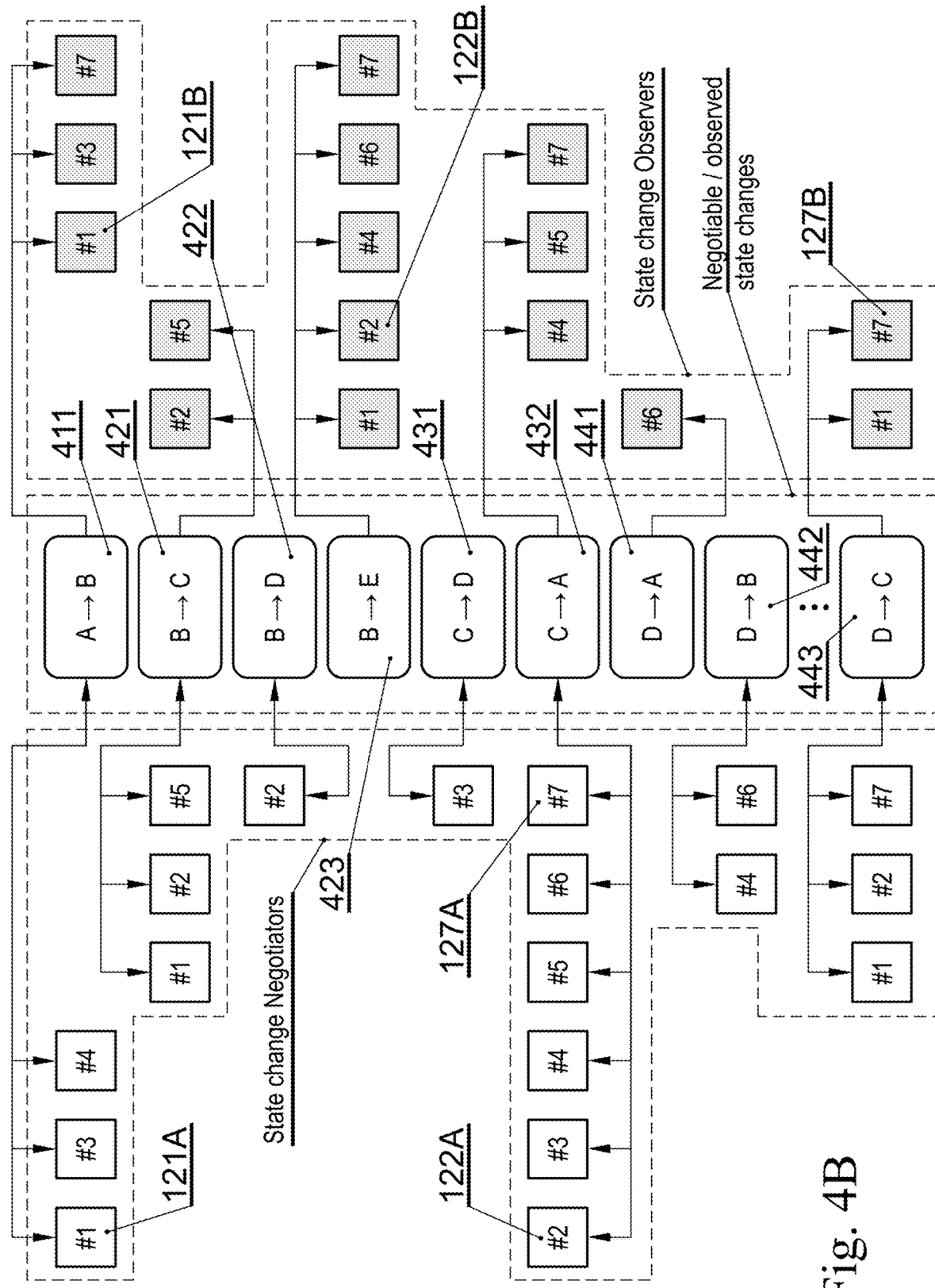
FIG. 4B shows an example of a transition map between given states presetting modules that negotiate a give transition and modules that listen for a state change.

FIG. 4B shows an example of a transition map between given states presetting modules that negotiate a give transition (listen and act on) and modules that observe a state change. It is favourable that the procedure of negotiating a transition from power consumption state X to state Y is negotiated only with those modules, which are interested in monitoring such transition (121A, 122A, 127A, 631), i.e. a change of power consumption state may influence their current or scheduled tasks. Thus, such modules declare interest in such negotiations.

Similarly, if a module operates in a power consumption state Y equally well as in power consumption state X, it may decide not to take part in such negotiations (623) since such change is irrelevant from its perspective.

Thus, when only selected modules negotiate selected transitions, information exchange traffic is reduced e.g. between the arbitrator (110) and the respective modules.

To this end, FIG. 4B presents 9 examples of transitions (411, 421, 422, 423, 431, 432, 441, 442, 443). Each power consumption state transition may have registered its negotiators (listeners) and observers. A negotiator (121A) actively takes part in said transition(s) and may influence its activation while an observer (121B) is passively notified about a transition.

Figure 5:
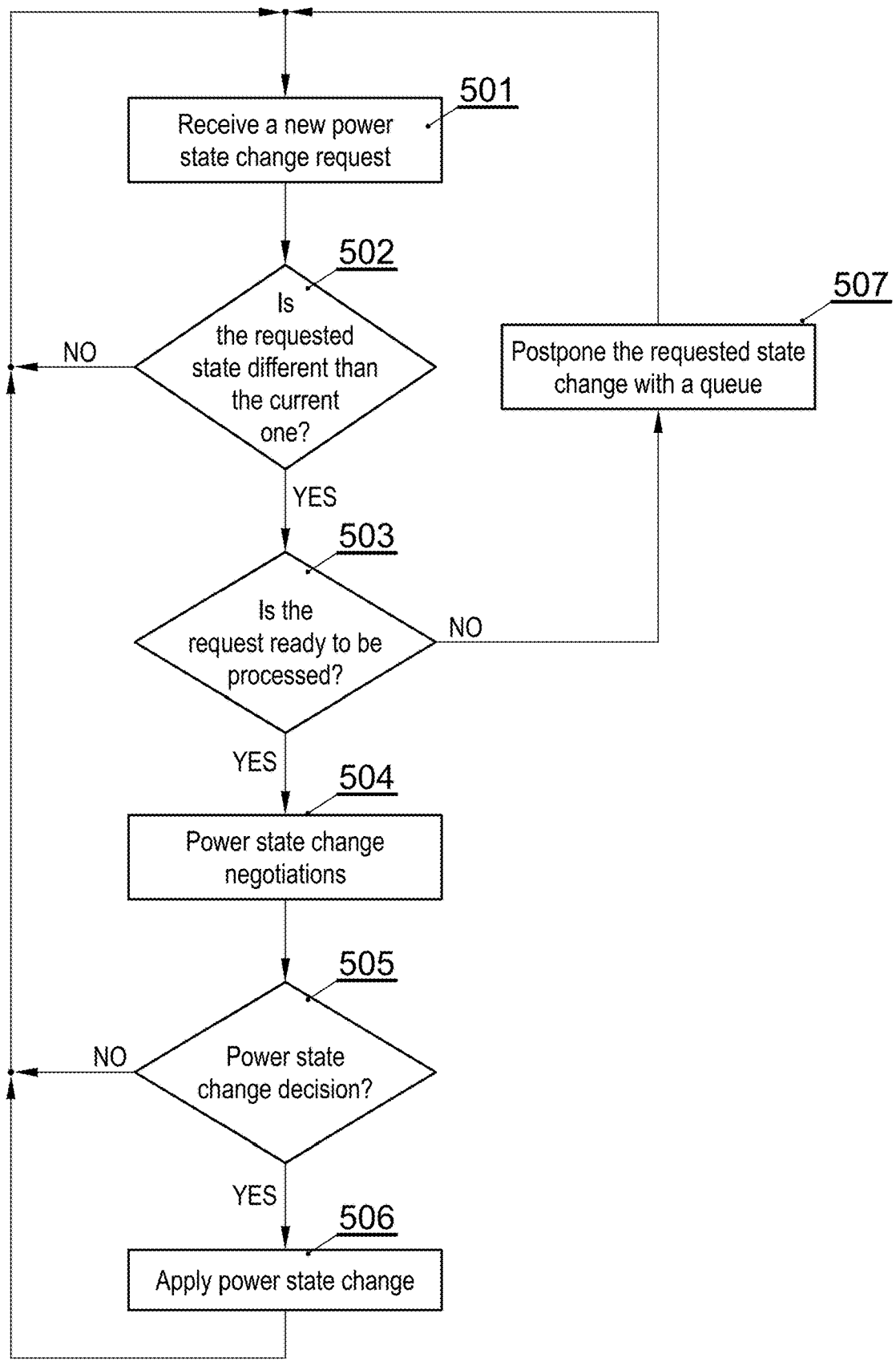
FIG. 5 presents a general overview of the present method.

FIG. 5 presents a general overview of the present method. At the first stage of the method there is executed an acceptance (501) of a request to change power consumption state if the requested power consumption state is different (502) from the current one.

In case a negotiation process, of at least one power consumption state transition, is ongoing (503), such a request is added to a queue of current negotiations (507). When the request is ready to be processed (503) (i.e. prior requests have been already executed according to said queue) the negotiation of the current request is executed (504). At this stage all listener modules, listening to the state change under negotiations, are notified and asked whether they agree to the power consumption change based on their current tasks and preferably scheduled tasks. Further, there is executed a step of collecting (505) responses from all modules participating in said negotiation and taking a decision on power consumption state change according to the outcome of said negotiations (responses). Lastly, the power consumption state according to said decision is applied (506).

Figure 6A:
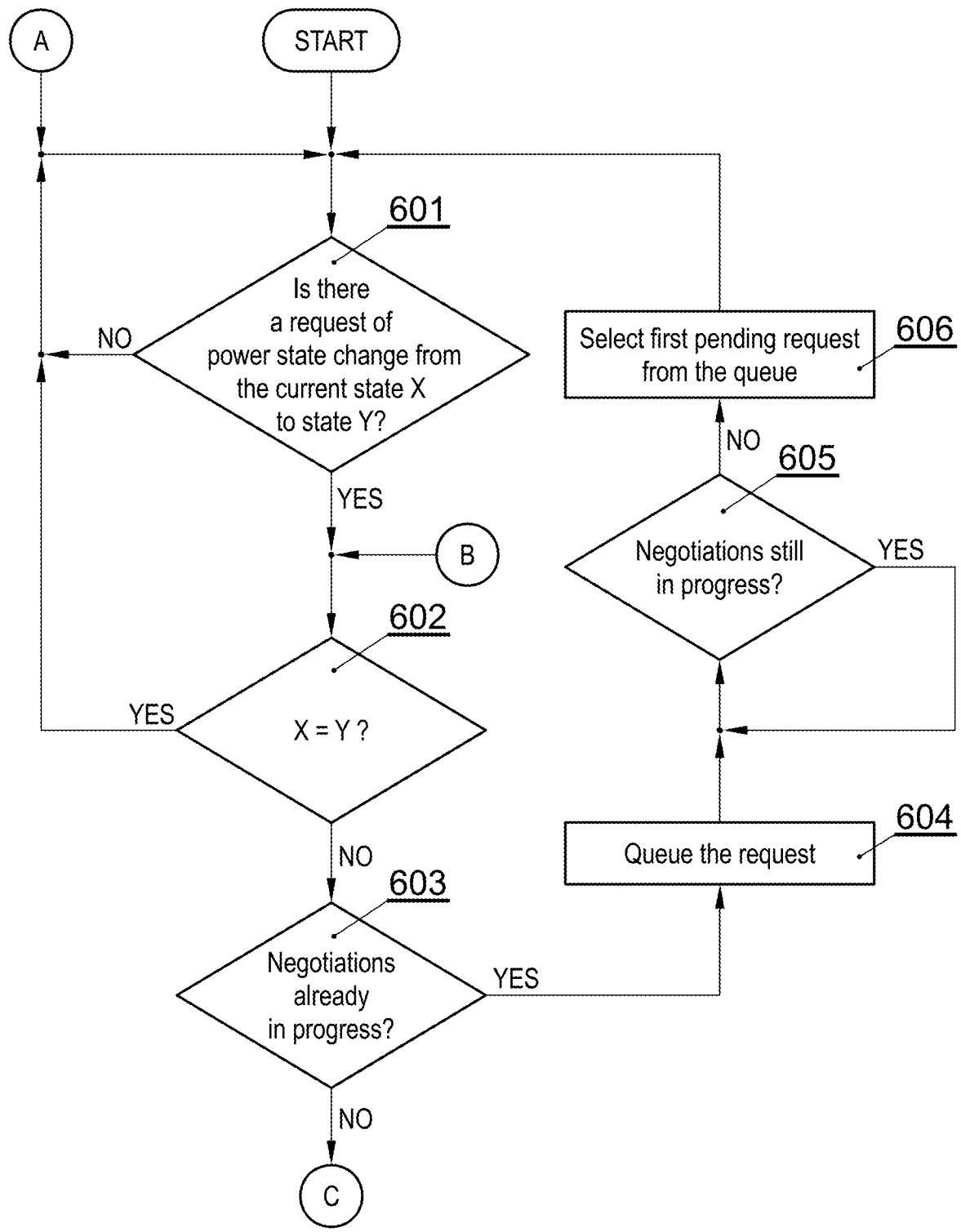
FIG. 6A depicts a first stage of the method i.e. accepting of a request to change state and queuing the request.
Figure 6B:
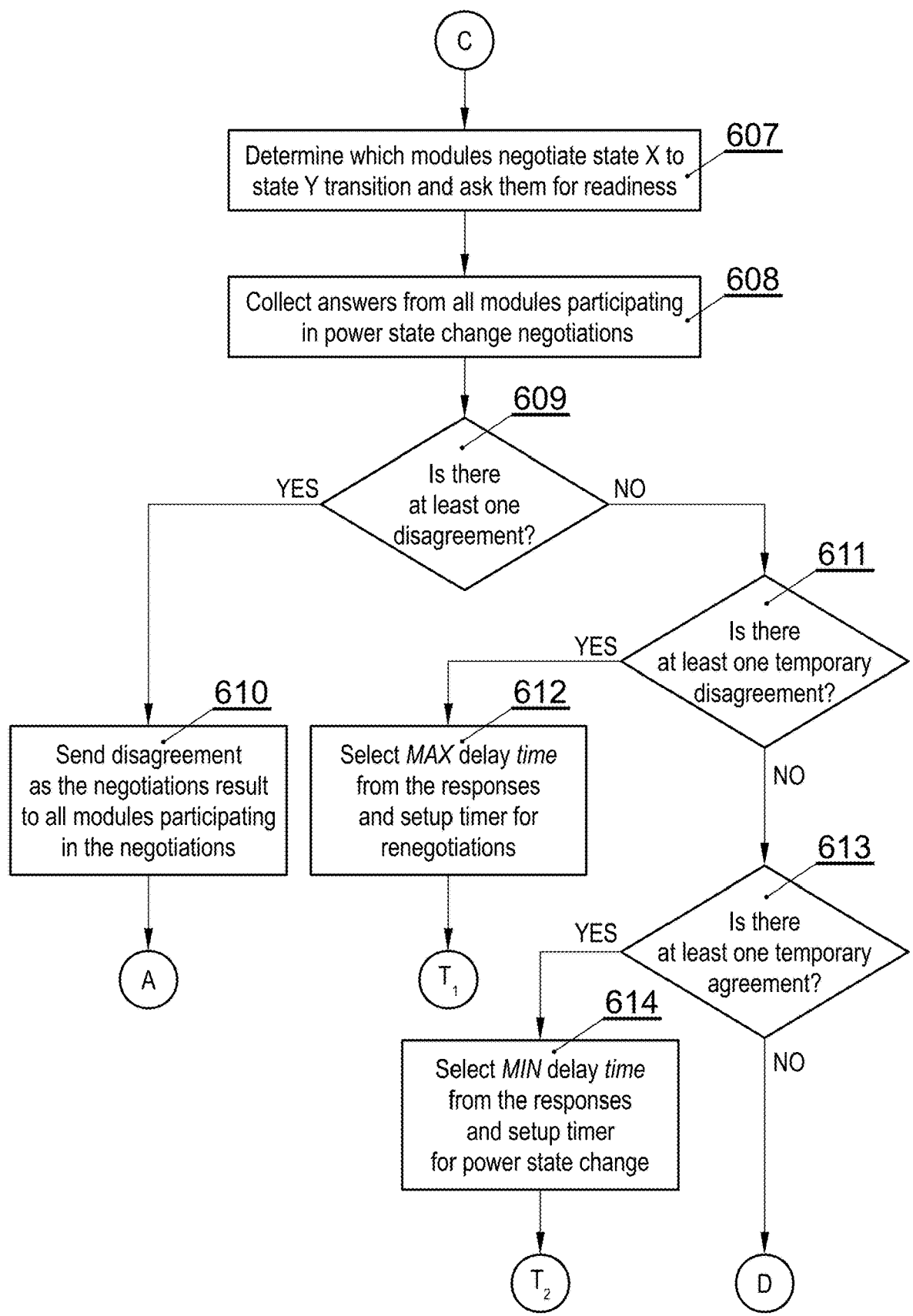
FIG. 6B Shows a second stage of the method i.e. negotiations, collecting of responses and taking a decision.
Figure 6C:
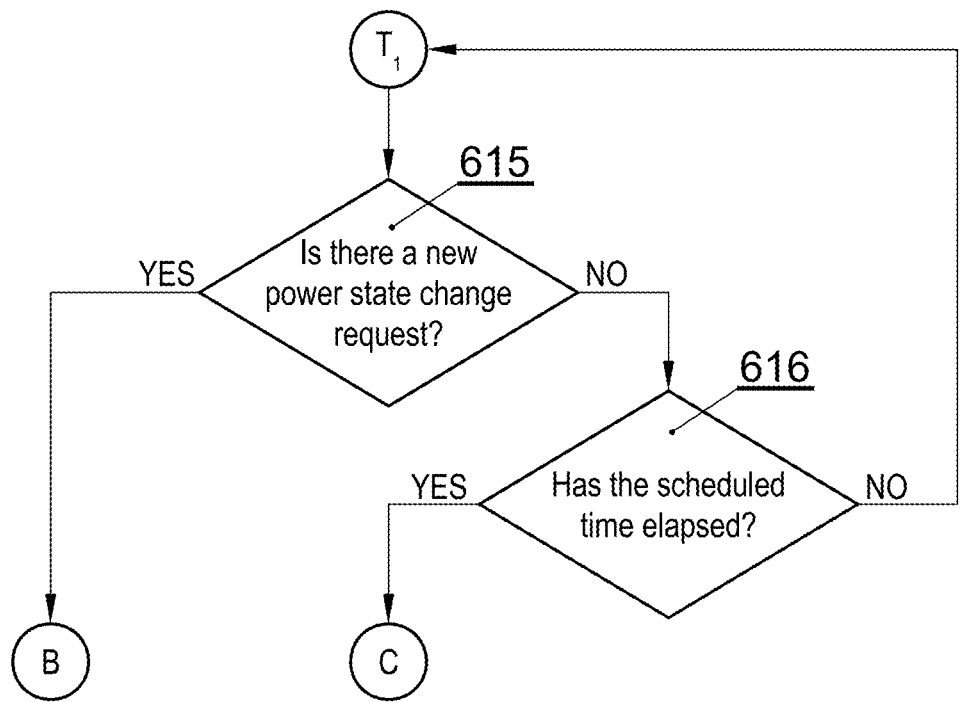
FIG. 6C shows a first Timer 1 i.e. awaiting renegotiation after a delay.
Figure 6D:
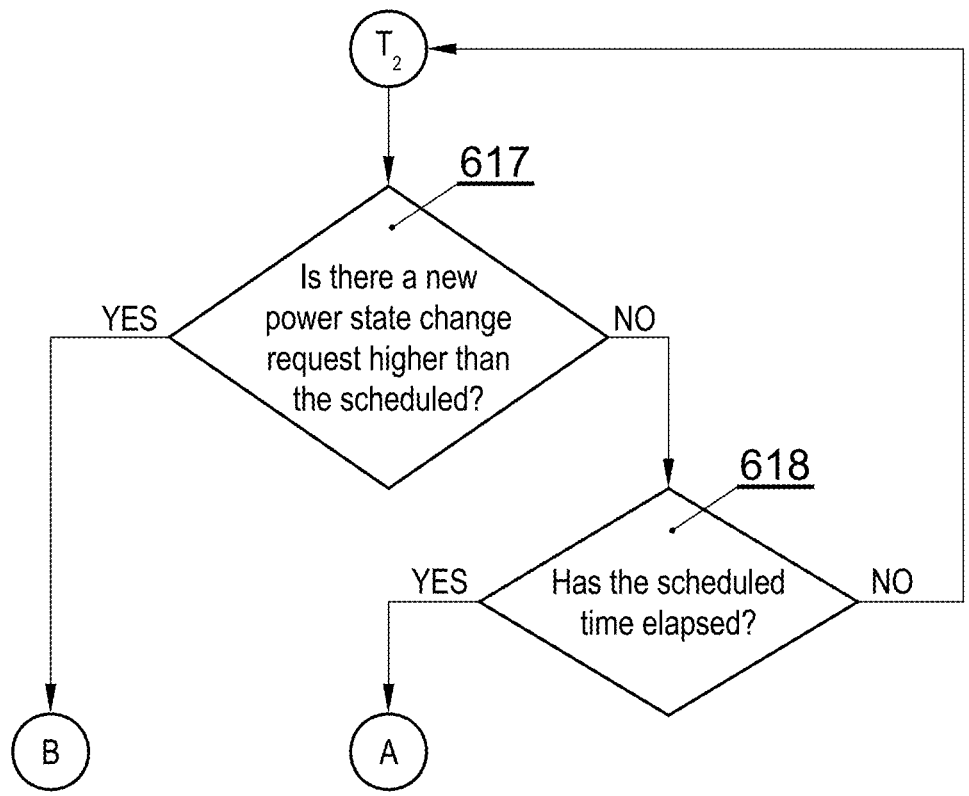
FIG. 6D shows a second Timer 2 i.e. awaiting a change of state after an agreement to the change.
Figure 6E:
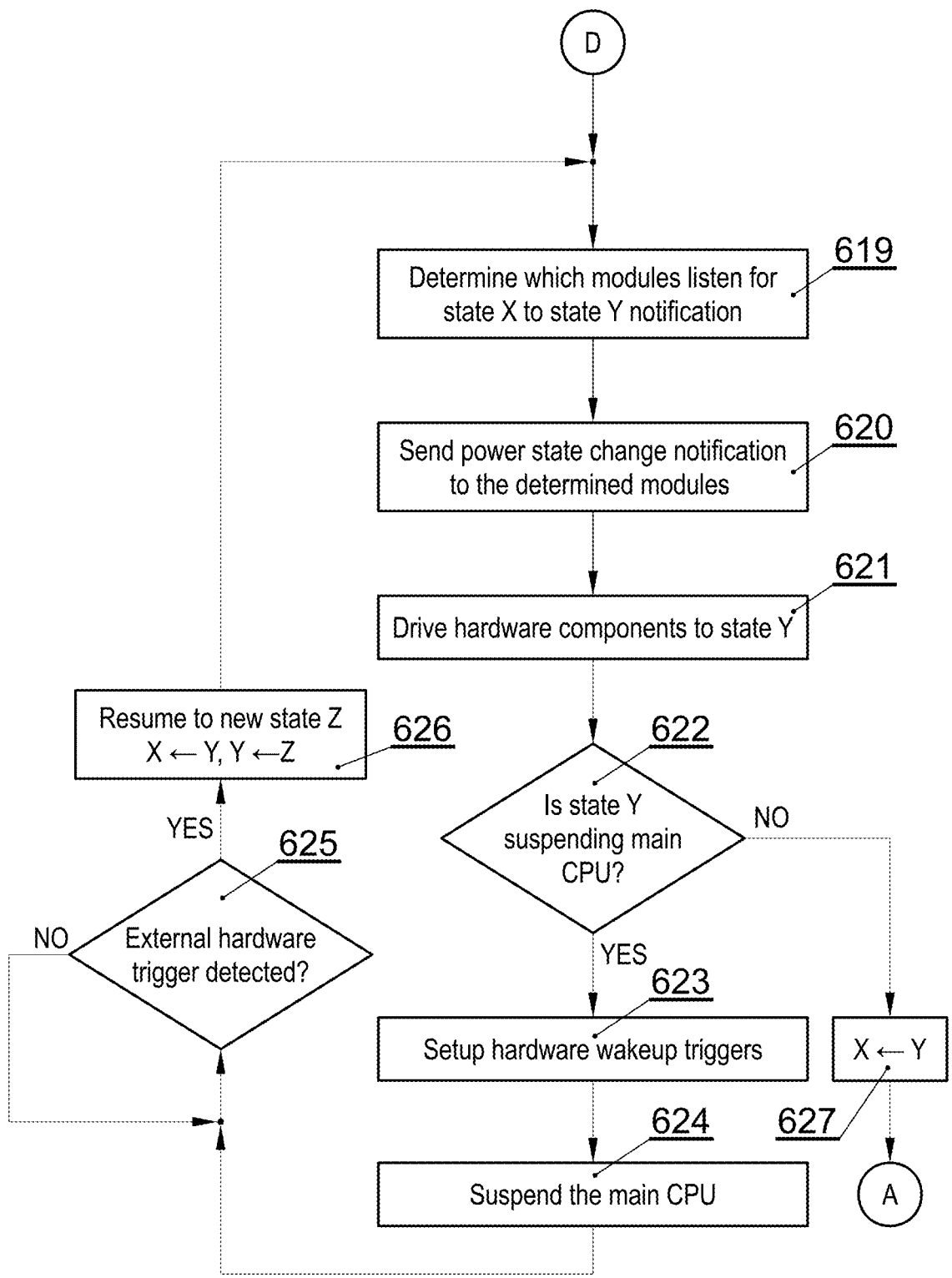
FIG. 6E shows a last stage of the method i.e. broadcasting state change and configuration of hardware components to a given mode.

FIGS. 6A-D depict details of the general method presented in FIG. 5. In particular FIG. 6A covers steps (501, 502, 503 and 507) of FIG. 5. FIG. 6B covers steps (504 and 505) while FIGS. 8C, 8D and 8E cover step (706).

FIG. 6A is aimed at receiving a request (601) for power consumption state transition, verifying whether the transition changes current state (602), queuing the request (604, 605, 606) in case other negotiations are pending and processing the request otherwise (exit point C).

FIG. 6B presents negotiations phase after a determination of which modules negotiate state X to state Y transition and asking these modules for acceptance (607). The arbitrator module collects (608) answers from all modules participating in the power state change negotiations.

During power state change negotiations (504) each module may respond in one of four ways. A module may refuse the request (610), approve, approve conditionally (for example for a given period (614) of time $T_2$) (613) or request re-negotiations after a timeout $T_1$ (612).

An agreement to a power consumption state transition means that a given module accepts the transition and does not predict any negative consequences of doing so. In contrast, a disagreement means that a given module may not transition to the selected power consumption state and it cannot predict when it will be ready to do so.

Conditional or temporary agreement (613) means a readiness to accept the transition but for a specified period of time i.e. after this time the module expects a return to the previous power consumption state in order to carry out its tasks. An example of such a case may be a recording scheduled to start in an hour. The status of said timer is checked at step (618).

Prior to execution of step (618), the system may check whether there is a new power state change request higher in hierarchy than the scheduled request (617). To this end power consumption states may be arranged hierarchically, for example in a form of a tree wherein each state has a priority level assigned (typically the higher the priority the more power is consumed in a given state).

At this step, there is a case when at least one module has temporarily agreed to a power state transition. During this time it may happen that the system will transition to a higher ranking power consumption state e.g. B (B>C). Step (617) is a decision on whether C will be enforced or a silent termination of the timer will be executed since the system is already in the B state which is sufficient for the module requesting the previous return to the C.

For example, an STB will in an hour record an event and the system allows to enter a deep sleep mode (e.g. power consumption state E) during this remaining hour. In order to record, the STB needs at least a stand-by mode B. Thus, the STB enters E temporarily and requests power consumption state B after said one hour. In case nothing happens during that hour, the STB will return to B when the timer expires. Otherwise, when during said one hour timer a user enforces an A power consumption state, the timer becomes obsolete because A is higher in hierarchy than the power consumption state B required by the recording module.

A request for re-negotiations (612) means a temporary inability of a given module to enter a power consumption state of a given transition. However, the module is able to estimate a time when it will be able to accept said power consumption state transition. An example of such a case may be software update. The status of said timer is checked at step (616) while alternatively another power state change request may be processed (615). There may be a case when more than one re-negotiations requests are received, then the longest time estimated (reported by said re-negotiations requests from the respective modules) may be applied.

When the arbitrator module has collected all answers it takes a decision (609, 611).

The last stage of the negotiations process is to draw conclusions based on collected responses. In case all modules accepted the transition, the arbitrator takes a decision to change into the requested state (FIG. 8E). The decision is sent to all modules taking part in the negotiations so that they preferably may apply a given state in a synchronous manner (506, 627).

Finally, the modules that are observers (121B, 122B, 127B, 423), of a given power state transition (completion of said transition), are notified about said transition (619, 620) and the transition is made (621).

In case at least one module refuses (609) a transition, the remaining modules are notified accordingly (610) and the transition process is discarded i.e. the device remains in its current power consumption state.

When there is present, among positive responses, at least one temporary/conditional acceptance (613), the remaining modules are notified accordingly. There may be a case when more than one conditional acceptances are received from respective modules, then the longest time (requested by any of the modules) may be applied in case the transition increases power consumption and the shortest time may be applied when the transition decreases power consumption.

In case the new power consumption state suspends the main CPU (622-624) i.e. the lowest possible power consumption mode is assumed in which it is only possible to request a higher ranking mode. Typically, all hardware is suspended except for a tiny module that is able to restart the system.

The following paragraphs present several real life examples of transitions between power consumption states implemented according to the present invention.

Example 1

There is a group of modules that by default accept transitions between power consumption states, and a video signal recording module. A user, viewing the video signal, has started recording of the live signal and switched the receiver to standby mode (the recording will be executed in the background with the TV display switched off). In order to minimize power consumption "active standby" will be applied and thereafter "deep sleep" mode will be requested. The recording module will not agree as it needs the recording capability and cannot predict the end of the live recording. Therefore, a situation according to step (613) occurs.

Example 2

Assuming the active standby of the Example 1 is applied and the recording module records an event, the end of which is known. In such a case the still recording module will respond negatively to a deep standby request but will ask for renegotiation after a given time. Therefore, a situation according to step (612) occurs. In case more re-negotiations are pending the one with the longest time is assumed.

Example 3

Assuming the active standby of the Example 1 is applied and one of modules accepts a deep standby for an hour while another accepts the deep standby for two hours. The arbiter will decide, at step (614), to enter the deep standby but for the shortest of the reported periods i.e. one hour.

At least parts of the methods according to the invention may be computer implemented. Accordingly, the present invention may take the form of an entirely hardware embodiment, an entirely software embodiment (including firmware, resident software, micro-code, etc.) or an embodiment combining software and hardware aspects that may all generally be referred to herein as a "circuit", "module" or "system".

Furthermore, the present invention may take the form of a computer program product embodied in any tangible medium of expression having computer usable program code embodied in the medium.

It can be easily recognized, by one skilled in the art, that the aforementioned method for managing electric power consumption may be performed and/or controlled by one or more computer programs. Such computer programs are typically executed by utilizing the computing resources in a computing device. Applications are stored on a non-transitory medium. An example of a non-transitory medium is a non-volatile memory, for example a flash memory while an example of a volatile memory is RAM. The computer instructions are executed by a processor. These memories are exemplary recording media for storing computer programs comprising computer-executable instructions performing all the steps of the computer-implemented method according the technical concept presented herein.

While the invention presented herein has been depicted, described, and has been defined with reference to particular preferred embodiments, such references and examples of implementation in the foregoing specification do not imply any limitation on the invention. It will, however, be evident that various modifications and changes may be made thereto without departing from the broader scope of the technical concept. The presented preferred embodiments are exemplary only, and are not exhaustive of the scope of the technical concept presented herein.

Accordingly, the scope of protection is not limited to the preferred embodiments described in the specification, but is only limited by the claims that follow.

The invention claimed is:

1. Method for managing electric power consumption of a device in which is comprised a plurality of hardware modules, each hardware module configured to independently perform within said device one or more tasks requiring electric power consumption, such that said hardware modules require varying power consumption states at varying times depending on said one or more tasks, and in which each given hardware module is configured to request a power consumption state change based on the given hardware module's current or future power consumption requirements, each hardware module including a listener module configured to participate in power consumption state change negotiations, the method comprising:

providing an arbitrator module comprised within said device, said arbitrator module being both physically distinct and operationally independent from each of the plurality of hardware modules, said arbitrator module configured to manage a power consumption state change negotiation by performing the steps of:

notifying and asking all listener modules listening to the state power consumption change under negotiations, whether the listener modules agree to the power consumption change based on current tasks and scheduled tasks of the listener modules;

collecting responses from all of the listener modules participating in said negotiations; and taking a decision on power consumption state change according to the collected responses, wherein said decision comprises: i) responsive to a request for a power consumption state increase: increasing power consumption for a first time period and thereafter reducing power consumption, the first time period corresponding to a longest time requested by any listener module, and ii) responsive to a request for a power consumption decrease: decreasing power for a second time period and thereafter increasing power consumption, the second time period corresponding to a shortest time requested by any listener module.

2. The method according to claim 1 wherein said decision further includes: iii) responsive to a request for a re-negotiation after expiry of a given time period: delaying processing of the request until after expiry of the given time period.

3. The method according to claim 1 wherein power consumption states are arranged hierarchically, wherein each power consumption state has a priority level assigned.

4. The method according to claim 1 further comprising generating a transition map, between given power consumption states, identifying the listener modules that negotiate a given power consumption state transition and the listener modules that observe the given power consumption state transition.

5. The method according to claim 1 wherein the decision is sent to all of the listener modules taking part in the negotiations so that all of the listener modules apply a given power consumption state in a synchronous manner.

6. The method according to claim 1 wherein in response to at least one of the listener modules refusing a power consumption state transition request, the remaining listener modules are notified accordingly and the transition is discarded.

7. A non-transitory computer readable medium storing computer-executable instructions to perform the method of claim 1.

8. A computer-based arbitrator module comprised within an electronic device and configured to manage power consumption state change negotiations in respect of a plurality of independent hardware modules also comprised within the device, each hardware module configured to independently perform one or more tasks requiring electric power consumption, such that the hardware modules require varying power consumption states at varying times depending on said one or more tasks, and in which each given hardware module is configured to request a power consumption state change based on the given hardware module's current or future power consumption requirements, each hardware module including a listener module configured to participate in power consumption state change negotiations, the arbitrator module being configured to perform the steps of:

notifying and asking all listener modules listening to the state power consumption change under negotiations, whether the listener modules agree to the power consumption change based on current tasks and scheduled tasks of the listener modules;

collecting responses from all of the listener modules participating in said negotiations; and taking a decision on power consumption state change according to the collected responses, wherein said decision comprises: i) responsive to a request for a power consumption state increase: increasing power consumption for a first time period and thereafter reducing power consumption, the first time period corresponding to a longest time requested by any listener module, and ii) responsive to a request for a power consumption decrease: decreasing power for a second time period and thereafter increasing power consumption, the second time period corresponding to a shortest time requested by any listener module, wherein said arbitrator module is both physically distinct and operationally independent from each of the plurality of hardware modules.

9. An electronic device comprising the arbitrator module of claim 8.

* * * * *